United States Patent [19]

Bluzer

[11] 4,359,651
[45] Nov. 16, 1982

[54] ANTI-BLOOMING INPUT STRUCTURE FOR CHARGE TRANSFER DEVICE

[75] Inventor: Nathan Bluzer, Silver Spring, Md.

[73] Assignee: Westinghouse Electric Corp., Pittsburgh, Pa.

[21] Appl. No.: 198,905

[22] Filed: Oct. 21, 1980

[51] Int. Cl.³ .................. H03K 3/42; G11C 19/28; H01L 29/78; H01L 27/14
[52] U.S. Cl. ..................... 307/311; 307/221 D; 357/24
[58] Field of Search .............. 357/24 M, 24 LR, 30; 307/221 D, 311

[56] References Cited

U.S. PATENT DOCUMENTS

| | | | |
|---|---|---|---|
| 3,866,067 | 2/1975 | Amelio | 357/24 LR |
| 3,896,474 | 7/1975 | Amelio et al. | 357/24 LR |
| 4,028,716 | 6/1977 | Van Santen et al. | 357/24 M |
| 4,247,788 | 1/1981 | Bluzer | 307/221 D |

*Primary Examiner*—Gene M. Munson
*Attorney, Agent, or Firm*—H. W. Patterson

[57] ABSTRACT

A charge transfer device having a transistor input signal divider is provided with blooming control electrode portions and blooming control drain regions to rapidly draw any excessive charge from the potential wells.

10 Claims, 6 Drawing Figures

ANTI-BLOOMING INPUT STRUCTURE FOR CHARGE TRANSFER DEVICE

GOVERNMENT CONTRACT

The Government has rights in this invention pursuant to Contract No. N00173-78-C-0212 awarded by the Department of the Navy.

CROSS-REFERENCE TO RELATED APPLICATION

The present application is related to U.S. Ser. No. 953,809, filed in the U.S. Patent and Trademark Office on Oct. 23, 1978 by Nathan Bluzer, and entitled "Charge Transfer Device With Transistor Input Signal Divider", U.S. Pat. No. 4,247,788, which application is incorporated herein by reference.

BACKGROUND OF THE INVENTION

The present invention relates to charge transfer devices; and more particularly, to charge transfer devices having an anti-blooming input structure.

Inherently, charge transfer devices can accommodate only very low currents. Specifically, the current handling capability of a very high speed charge transfer device is in the hundred microampere region; and generating such a low current level at high frequencies through high impedance lines is difficult, and susceptible to induced noise currents by capacitance coupling and leakage currents that are enhanced by offset voltages. A higher level input signal applied to such input structure tends to exhibit better noise immunity than low level input signals. However, such higher level input signals are generally too great for charge transfer devices, in that the potential wells become saturated with charge. In my copending application, Ser. No. 953,809, filed on Oct. 23, 1978 which is incorporated herein by reference, there is described an improved charge transfer device that has an input portion structured so that a distinct predetermined fraction of the signal input current is directed to the adjacent or first potential well of the device. Also, such charge transfer device has a signal input portion that includes a bi-polar transistor where the channel in which the potential well or wells resides is the virtual collector of such input structure. In a more specific manner, the charge transfer device of my copending application describes an input portion that includes an injection transistor and at least one partitioning transistor. The bases or gates of the injection and partitioning transistors are common. The collector or drain of the injection transistor is structured to form a part of the potential well channel. For high-speed operation and to provide noise immunity, one or more partitioning transistors are provided where the collector or drain of the partitioning transistor or transistors, as the case may be, which is separated from the charge packet channel or collector of the first transistor, is connected to a DC source in common with the common bases. The input signal is applied to the commonly connected emitters of the injection and partitioning transistors; and the total base emitter junction area of the injection transistor is smaller than the total base emitter junction of the partitioning transistor or transistors in proportion to the fraction of the input signal that is to be directed to the adjacent potential well. This signal input structure enhances the input of high frequency signals and the signal-to-noise ratio of the input signal. Also, the signal input portion involves only a single step without additional input clocking circuits in order to maximize the bandwidth of the input signal. Thus, with such a structure, the input signal level may be sufficiently high to provide better noise immunity and the current level may be sufficiently low for the metering of charge packets for coupling or injection into the transfer or shift register portion of the device.

It may be desirable, however, for some applications to operate the charge transfer device by continuously injecting signal current therein, or by changing the clocking speed of the CTD. Under such conditions, a phenomena may occur, where the signal current, in effect overflows and spreads into adjacent potential wells. Such spreading is commonly referred to as "blooming". Blooming occurs if the signal exceeds the charge handling capacity of the potential wells of the device.

Thus, it is desirable to provide a high speed input structure for a charge transfer device that permits a high input signal level, and yet prevents "blooming" in applications where the signal exceeds the capacity of a potential well.

SUMMARY OF THE INVENTION

In accordance with the present invention, there is provided a charge transfer device that has a substrate of semiconductor material with an elongated channel and a plurality of gate electrodes overlying said channel for storing and transferring individual charge packets at predetermined positions along said channel. A signal input portion of the device includes an injection transistor and at least one partitioning transistor adjacent the channel and being in integral part of said device for creating an individual charge packet in one of said predetermined positions in response to an injected electrical signal. The injection and partitioning transistors are structured relative to each other to cause a charge packet to be directed into the channel having a magnitude representative of a predetermined fraction of the magnitude of said electrical signal applied to the signal input portion. A pair of blooming electrodes are laterally positioned and spaced from each other and adjacent to the opposite sides of the CTD channel and adjacent the first of said plurality of gate electrodes. A blooming drain region is disposed adjacent each one of said pair of blooming electrodes. The emitter portion of the injection transistor is disposed between the spaced blooming electrodes and the respective blooming drain regions.

DESCRIPTION OF THE PREFERRED EMBODIMENT

In utilizing the term "charge transfer device", hereinafter referred to as CTD, it is meant to include charge coupled devices (CCD), bucket brigade devices (BBD), and other devices that have input portions to form charge packets and readout the analog or digital values of such charge packets, except photosensitive devices, which of course, in many instances, do not require an input portion. The term CCD as used herein is meant to include both the surface channel and the bulk channel types of devices. The term "surface channel" is meant to include those devices where the charge is moved between a semiconductor body and the overlying dielectric. In the bulk channel type of CCD, the term includes those devices where the charge is moved within the semiconductor body. The term "bulk channel" (CCD) is meant to include both those that have a shallow channel and a deep channel that is greater than one micron. In the shallow channel devices, those included the CCD devices referred as "buried channel" or "bulk channel". The deep channel (CCD) devices include the type known as Peristaltic devices. It is contemplated, that the devices in accordance with the present invention will provide simplicity in structure and operate equally as well regardless of the particular type of CTD. However, the description of the present invention includes the bulk channel type of CCD; and more particularly the CCD known as the Peristaltic type, which demonstrates high speed characteristics. It is understood that the particular geometric structure of the present invention is also advantageous in the construction of any type of CCD, BBD, or other type of CTD; and the various CTD devices described herein may be fabricated in a conventional manner utilizing known diffusion, implantation, and epitaxial techniques.

Figure 1:
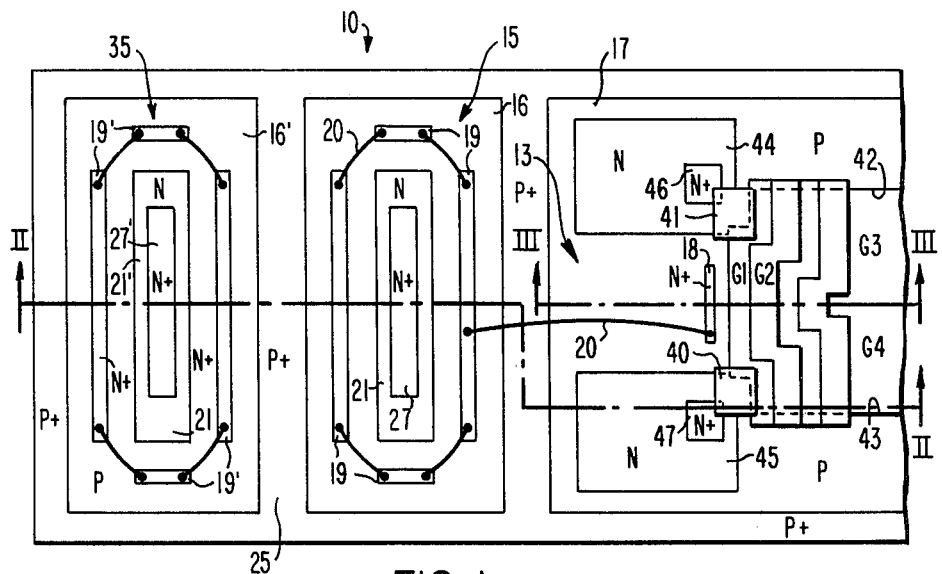
FIG. 1 is a plan view of a charge coupled device having an input structure in accordance with one embodiment of the present invention.
Figure 2:
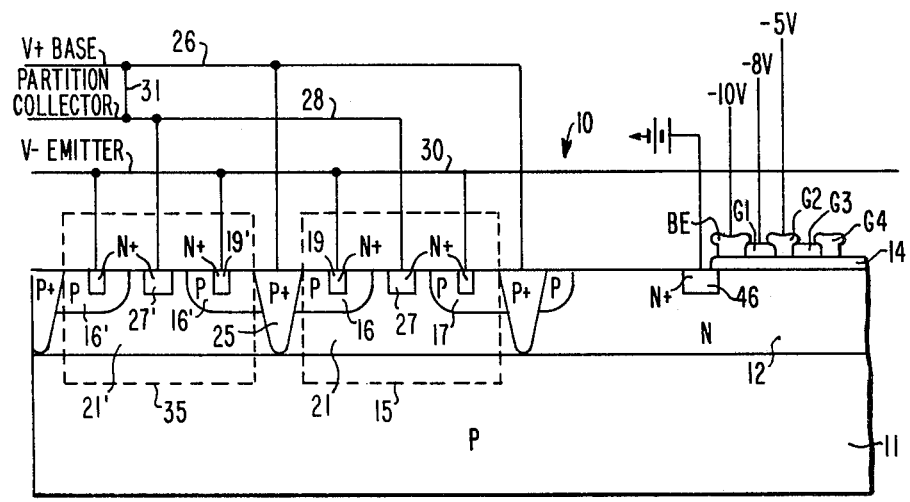
FIG. 2 is a sectional view of FIG. 1 taken on line II—II of FIG. 1.
Figure 3:
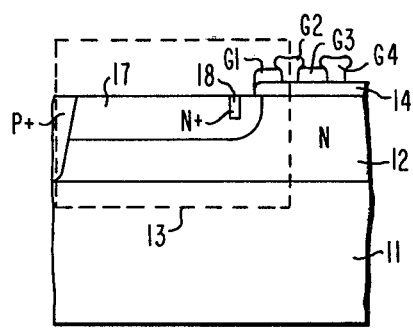
FIG. 3 is a sectional view of FIG. 1 taken on line III—III of FIG. 1.

Referring to FIG. 1, it is to be noted that for purposes of illustration and clarity, the dielectric and the metallic connections have been omitted from the plan view of this Figure. FIGS. 1 and 2 represent the input and a portion of the transfer structure that is manufactured on a planar base surface with bi-polar type devices; and illustrates in detail a typical connection of the various input transistors for typical operation. A fragmentary portion of a CTD device referred to generally at 10, has a substrate 11 that may be formed of any semiconductive material, such as silicon or gallium arsenide, for example, and be in the neighborhood of 13 mils thick. Overlying the substrate 11 is a channel portion layer or region 12 which is doped with an impurity of the opposite conductivity type, and may be anywhere from one to five microns deep to form the potential wells beneath gates G1, G2, G3 and G4. The N-type impurity also forms a collector portion for an injection transistor 13. The width of the potential wells, which is that distance that is transverse to the succession of gates G1 through G4, for a high speed Peristaltic CTD, may be in the order of 200 microns, for example. For a buried channel CTD, such doping of layer 12 with the N-type impurity may be constant or uniform throughout. However, for the Peristaltic type device, the doping is preferably graded where the density of the impurities increases towards the surface adjacent a dielectric portion 14 (see FIG. 2). A second transistor 15, which may be termed a partitioning transistor has a base 16 formed from a P-type impurity which is also common with a base portion 17 for the injection transistor 13. The narrowest portion of the base regions 16 and 17 measured from the emitter to the collector regions may be submicron or 1 to 2 microns thick for high speed operation. The transistors 13 and 15 each have an emitter region 18 and 19, respectively, which may be approximately 4 microns wide, which distance is that distance transverse to its greatest length as shown in the drawings, and connected to each other by wires 20 as shown in FIG. 1. The collector region 12 of the injection transistor 13 is then common with the potential well channel located within region 12; and the partitioning or mirror transistor 15 has a collector portion 21 formed of an N-type impurity which may be 1 to 5 microns thick, for example. In order to form an ohmic junction with the base regions 16 and 17, a P+ region 25 is formed and it preferably contacts the substrate 11. The base regions are commonly connected as shown diagrammatically in FIG. 2 by wire 26. The collector portion 12 of the transistor 15 has an N+ portion 27 to provide ohmic contact with a wire 28. The emitter region 18 of the transistor 13, and emitter region 19 of the transistor 15 are connected by a line 30 to an AC signal source through a capacitor and to a DC source through a resistor (not shown). The common base connection 26 for the transistors 13 and 15 is connected to the collector 21 by a line diagrammatically shown at 31. A DC potential is applied to the common base and partition collector connections that is more positive than the DC potential applied to the emitter terminals 18 and 19. A typical current that may be applied by the DC source may be 2 milliamps, for very high speed operation for example. The area of the emitter base junction of the transistor 13 is in a certain ratio to the area of the emitter base junction of the transistor 15. The current which is injected into the emitter is divided between the transistor 13 and 15 in accordance with the proportionate base emitter junction areas of the first transistor 13 and the transistor 15. In the event that a large ratio is desired, that is at the area of the base emitter junction of the partitioning transistors is substantially greater than a base junction of the transistor 13, another partitioning transistor 35 may be formed to provide the additional area. The transistor 35 is similarly configured to the transistor 15 and includes emitter portion 19', a base portion 16' in common with the base portion 16 of the transistor 15, a collector portion 21'. The emitter 19', base 16', and collector 21' regions of the transistor 35 are connected to the emitter base, and collector regions, respectively, of the transistor 15 which in effect increases the base emitter junction area thereby increasing the ratio between the partitioning transistors and the first or injection transistor.

Figure 4:
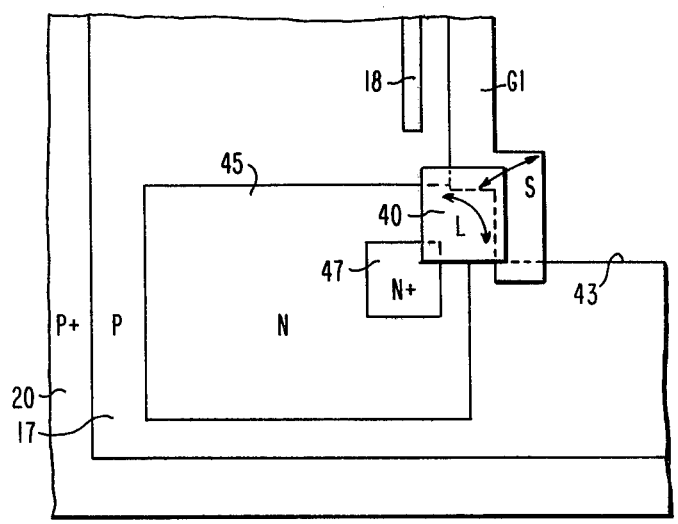
FIG. 4 is a highly magnified fragmentary view of a portion of FIG. 1 to show in more detail the blooming control structure.

Referring again to FIGS. 1, 2 and 4, and in accordance with the described embodiment of the present invention, a blooming electrode means BE (FIG. 2) has distinct portions 40 and 41 (see FIG. 1), each of which is disposed at opposite ends and spaced from the emitter region 18 of the injection transistor 13 and adjacent to the respective ends of the gate electrode G1, and overlaying an insulative layer 14 (FIG. 2), of silicon dioxide, for example. The channel region 12 includes enlarged N-type semiconductor regions 44 and 45, in communication with and extending rearwardly beyond gate G1 beneath and beyond the respective blooming electrode portions 40 and 41. In other words, the N-type regions 44 and 45 are rearward continuations of the channel 12, with such continuations 44 and 45 extending rearwardly of the gate electrodes G1, G2 and G3. The N-type regions 44 and 45, which may be rectangular in configuration (FIG. 1), are also disposed and spaced from opposite ends of the emitter 18 and bound the P-type base diffusion region 17 of the transistor 13. The base width between emitter 18 and regions 44 and 45 is larger than the base width between the emitter 18 and that portion of the channel 12 beneath gate G1. Disposed beneath a portion of each blooming electrode 40 and 41 and diffused in the respective N-type regions 44 and 45 is a blooming drain region 46 and 47 respectively. Input gates G1 and G2 overlay the silicon dioxide layer 14 and are disposed such that G1 slightly overlaps the blooming electrode portions 40 and 41. As shown by the enlarged fragmentary view of FIG. 4, the path between the potential well under gate G1 and the blooming drain regions 46 and 47 as noted by the arrow S in FIG. 4 for region 47 should be as short as practicable while the width of such path as noted by the arrow L in FIG. 4 for region 47 should be as wide as practicable. This geometry insures rapid drawing of any excessive charge away from the wells under G1 and G2. The charge transfer gates G3 and G4 are disposed serially in the direction of charge flow in a well known manner to define the additional potential wells of the device.

The N+ drain regions 46 and 47 are connected to a positive potential sufficient to attract carriers, while the blooming electrode means BE, comprised of the separate portions 40 and 41 are connected to a less positive potential. The gate G1 is connected to a more positive potential than the electrode BE while the gate G2 is connected to a more positive potential than the gate G1. Although FIG. 2 indicates absolute values applied to the electrode BE and gates G1 and G2, such values are merely typical and of course depend on the doping concentration of the N+ regions 46 and 47, the N-type regions 44, and the potential bias level applied to the channel region 12.

Figure 5:
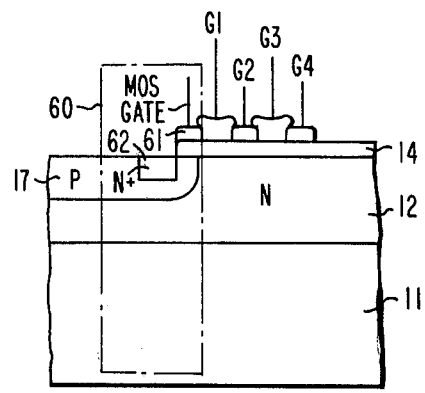
FIG. 5 is a modification of FIG. 3 to illustrate a depletion mode field effect embodiment utilizing the present invention.

FIG. 5 bears the same reference numerals for similar portions of the charge transfer device as the previous figures, and is included to illustrate such a device that is comprised of a depletion mode transistor within the dashed lines referred to at 60 instead of the bi-polar structure previously described. This Figure illustrates on MOS gate 61 overlaying the layer 14 functionally replacing the P+ base portion 20, and emitter region 18 is replaced by a functional equivalent source 62. The remaining portions of the input structure, that is the blooming control geometry, are similar to the previously shown and described geometry.

Figure 6:
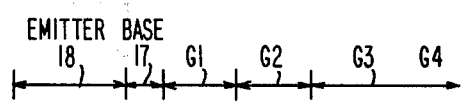
FIG. 6 is a graph illustrating conduction band potential desirable for the operation of the blooming control input structure in the present invention.
Figure 6:
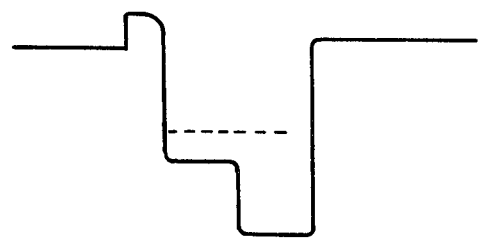

In operation, a signal is applied to the emitter 18 and integrated in the holding well defined by the gate G2, and then with more integrated signal begins to spread to the wider potential well defined by gate G1 and G2. After reaching a certain potential level, as indicated by the dashed line in FIG. 6, the carriers begin to spread into the potential regions formed by and under the blooming control electrodes 40 and 41. As the charge spreads under 40 and 41 it begins to drain into N+ regions 46 and 47. Because the potential level represented by the dashed line, which is controlled by the voltage applied to the BE electrode, is reached by the carriers prior to the potential level under the gates G3 and G4, the blooming control in accordance with the present invention is effected. Referring to FIG. 6, a voltage is applied to the emitter 18 which becomes an electron carrier and are injected across the base 17 into the more positive potential well under G1 and G2 making the well potential less positive as charge electrons are integrated or collected therein. In other words, the charge signal is injected into the emitter 18 and enters the N region under gates G1 and G2 by diffusing across the base region 17. Once the charge enters the region under gates G1 and G2, it begins to accumulate in a potential well as shown by FIG. 6. If the input signal is sufficiently large, the charge will exceed the potential level established by gate electrodes G3 and G4 and/or the potential level established by the base 17 before the charge is transferred out of the input well into the transfer device channel 12 (see FIG. 2). The phenomenon is referred to as "blooming" in a CTD device. Part of the excess charge that enters the CTD channel mixes with the charge signal and, another part of the excess charge disrupts the bias conditions of the bi-polar input transistor 13. In accordance with the present invention, the potential of the blooming electrode BE is adjusted to form an intermediate potential energy level as shown by the dashed line in FIG. 6. This potential energy level of the blooming electrode BE limits the amount of charge that can accumulate in the input wells under the gates G1 and G2. The excess charge; that is, the charge that exceeds the potential level established by the blooming control electrode BE, is then diverted to the blooming drain 46 and 47. Thus, the maximum signal charge entering the CTD channel 12 is limited by the potential on the blooming electrode BE. In one actual reduction to practice, such a device operated satisfactorily at frequencies in the neighborhood of 250 megahertz.

Thus, there is provided an improved input structure for a charge transfer device that permits the application of high frequency signals having a high input signal level that provides a current level that is sufficiently low for the metering of charge packets and yet prevents the signal from exceeding the charge handling capacity of the input well of the device.

What I claim is:

1. In a charge transfer device for storing and transferring charge packets from the potential well to another along a channel of one conductivity type of semiconductor material that overlays a body of opposite type semiconductor material and having a plurality of gate electrodes adjacent one end of the channel, each defining a potential well, and including a bi-polar injection transistor having a collector region constituting a portion of the transfer channel adjacent one of the potential wells and a base region forming a PN junction with a portion of the channel region constituting the collector, and an emitter region spaced from the channel region and forming a PN junction with the base region, and further including a partitioning transistor having a base common with the injection transistor and a collector disconnected from the collector of the junction transistor, the emitter base junction area associated with a collector of the partitioning transistor being of predetermined size relative to the base emitter junction area associated with the collector of the injection transistor, the improvement of a blooming control electrode means spaced from the emitter region of the injection transistor adjacent one of the gate electrodes, a blooming control drain region of the same conductivity type as the channel region but more heavily doped underlying at least a portion of the blooming control electrode means, means to bias the blooming control electrode means more negative than the adjacent gate electrode and to apply a voltage to the drain region to provide a predetermined potential sufficient to attract carriers, and means to apply an electrical input signal to the emitter regions, whereby the injection transistor injects a predetermined fraction of the input signal to the charge transfer channel and the drain region absorbs any quantity of charge in excess of the capacity of the first potential well adjacent the blooming control electrode means.

2. In a charge transfer device according to claim 1 wherein the blooming control electrode means is comprised of two distinct portions, each of which is spaced from opposite ends of the emitter region of the junction transistor adjacent opposite sides of the transfer channel.

3. In a charge transfer device according to claim 2 wherein the blooming control drain region is comprised of two distinct portions, each of which is associated with one of the blooming control electrode portions.

4. In a charge transfer device according to claim 1, 2 or 3, wherein the transfer channel is N-type semiconductor material and the blooming drain region disposed therein is N+-type semiconductor material.

5. In a charge transfer device that includes a body of semiconductor material of one type of conductivity with an elongated channel and a plurality of gate electrodes overlying said channels for storing and transferring individual charge packets at predetermined positions along said channel, and having a signal input portion that includes an injection transistor and at least one partitioning transistor adjacent the channel for creating an individual charge packet and one of said predetermined positions in response to an injected electrical signal wherein said injection and partitioning transistors are structured relative to each other to cause a charge packet to be directed into said channel having a magnitude representative of a predetermined fraction of the magnitude of said electrical input signal, the improvement of, a blooming control electrode means adjacent one of the gate electrodes, a blooming control drain region of the same conductivity type as the channel but more heavily doped underlying at least a portion of the blooming control electrode means, means to bias the blooming control electrode means more negative than the adjacent gate electrode and to apply a voltage to the drain region to provide a predetermined potential sufficient to attract carriers, and means to apply the electrical input signal to the injection transistor, whereby the injection transistor injects a predetermined fraction of the input signal to the charge transfer channel and the blooming control drain region absorbs any quantity of charge in excess of the capacity of the first potential well adjacent the blooming control electrode means.

6. In a charge transfer device according to claim 5 wherein the length of the path between the adjacent gate electrode and the blooming drain region is shorter than the width of said path for drawing any successive charge away from the potential wells.

7. In the charge transfer device according to claim 5 wherein the blooming control electrode means is comprised of two distinct portions, each of which is spaced adjacent opposite sides of the transfer channel.

8. In a charge transfer device according to claim 7, wherein the blooming control drain region is comprised of two distinct portions, each of which is associated with one of the blooming control electrode portions.

9. In a charge transfer device according to claims 7 and 8, wherein the injection transistor is a bipolar transistor having an emitter region spaced between the blooming control electrode portions.

10. In a charge transfer device according to claim 7 or 8, wherein the transfer channel extends in a direction opposite to the transfer of charges rearwardly of the plurality of gates and underlies the blooming control drain regions.

* * * * *